United States Patent [19]

Hardy et al.

[11] Patent Number: 5,027,071
[45] Date of Patent: Jun. 25, 1991

[54] METHOD OF, AND APPARATUS FOR, NMR SLICE SELECTION

[75] Inventors: Christopher J. Hardy; Peter B. Roemer, both of Schenectady; Otward M. Mueller, Ballston Lake, all of N.Y.

[73] Assignee: General Electric Company, Schenectady, N.Y.

[21] Appl. No.: 489,124

[22] Filed: Mar. 5, 1990

[51] Int. Cl.$^5$ .............................................. G01R 33/20
[52] U.S. Cl. .................................................... 324/309
[58] Field of Search ............... 324/300, 307, 309, 318, 324/322

[56] References Cited

U.S. PATENT DOCUMENTS 4,954,779  9/1990  Zur ...................................... 324/306

Primary Examiner—Michael J. Tokar
Attorney, Agent, or Firm—Marvin Snyder; James C. Davis, Jr.

[57] ABSTRACT

A method of reducing slice profile degradation due to gradient signal amplitude ripple, has steps of: sensing the gradient signal ripple amplitude; normalizing the sensed ripple signal amplitude responsive to the gradient amplitude commanded; and modulating the RF signal amplitude with the adjusted-amplitude ripple signal, to cause the RF and gradient magnetic fields to have an effective vector pointing substantially in the same direction, during the slice-selection interval, as would the effective field vector formed with a gradient field devoid of ripple. Apparatus for reducing the slice profile degradation modulates the RF signal with the ripple envelope obtained from the output of the gradient signal amplifier, by a signal controlled by the gradient amplifier input.

19 Claims, 10 Drawing Sheets

METHOD OF, AND APPARATUS FOR, NMR SLICE SELECTION

BACKGROUND OF THE INVENTION

The present application relates to nuclear magnetic resonance (NMR) imaging and, more particularly, to a novel method of, and apparatus for, performing slice selection while utilizing a switch-mode gradient power amplifier in the NMR system.

The use of linear gradient power amplifiers in NMR imaging systems is now well known. The present-day trend to high-speed NMR imaging places additional, and generally severe, demands upon existing linear gradient power amplifiers. These energy-inefficient linear amplifiers are also a main source of consumption of expensive electric power in a NMR imaging (MRI) installation. It has been suggested that a high-efficiency switch-mode power amplifier be used for providing each of the required gradient magnetic field signals. Several switch-mode gradient power amplifiers investigated show substantial promise for producing stronger and faster gradient magnetic fields, while consuming less power than linear gradient power amplifiers. However, one presently unacceptable problem with the use of switch-mode power amplifiers is the presence of a ripple at the amplifier switching frequency (e.g. often in the 10-500 kHz. frequency range) generally of about 1% to about 10% in amplitude, which ripple appears on the gradient waveforms, and hence in the gradient magnetic field. This gradient magnetic field ripple degrades the slice profiles produced by standard slice-selection pulses. Methods of, and apparatus for, at least reducing the effects of the switch-mode gradient power amplifier ripple, upon slice selection, is therefor highly desirable.

BRIEF SUMMARY OF THE INVENTION

In accordance with the invention, a method of reducing slice profile degradation due to gradient signal amplitude ripple, comprises the steps of: sensing the gradient signal ripple amplitude; normalizing the sensed ripple signal amplitude responsive to the gradient amplitude commanded; and modulating the RF signal amplitude with the adjusted-amplitude ripple signal, to cause the effective magnetic field (i.e. that magnetic field, in a reference frame rotating about the static magnetic field, here Z, axis at the NMR resonance frequency, with a Z component caused by the gradient fields and with X and Y components caused by the RF field) to point substantially in the same direction, during the slice-selection interval, as would the effective magnetic field vector formed with a gradient field devoid of ripple.

In a presently preferred embodiment, apparatus for reducing the slice profile degradation modulates the RF signal with the ripple envelope obtained from the output of the gradient signal amplifier, by a current-monitoring sensor providing an input signal to an attenuator controlled by the gradient amplifier input signal; the controlled-amplitude ripple signal and the RF signal pulse are applied to a modulator means, prior to RF power amplification.

Accordingly, it is an object of the present invention to provide a novel method of, and apparatus for, reducing the slice-profile degradation caused by ripple upon the output of a switch-mode gradient magnetic field-providing power amplifier.

This and other objects of the present invention will become apparent upon reading the following detailed description, when considered in conjunction with the associated drawing figures.

BRIEF DESCRIPTION OF THE DRAWINGS

FIG. 1' is a schematic block diagram of an MRI

FIGS. 1b and 1c are graphs of respective excited transverse magnetization amplitude and phase, with respect to spatial location, for the normal slice-selection pulses of FIG. 1a;

FIGS. 2b and 2c are graphs of respective normalized excited transverse magnetization amplitude and phase, with respect to spatial location, for the ripple-containing slice-selection signal pulses of FIG. 2a;

FIGS. 3b and 3c are graphs of respective normalized excited transverse magnetization amplitude and phase for the novel slice-selection pulse signals of FIG. 3a; and FIGS. 4a and 4b are graphs of respective normalized excited transverse magnetization amplitude and phase for improperly phased modulation on the RF signal in the slice-selection pulse of FIG. 3a.

DETAILED DESCRIPTION OF THE INVENTION

Figure 1:
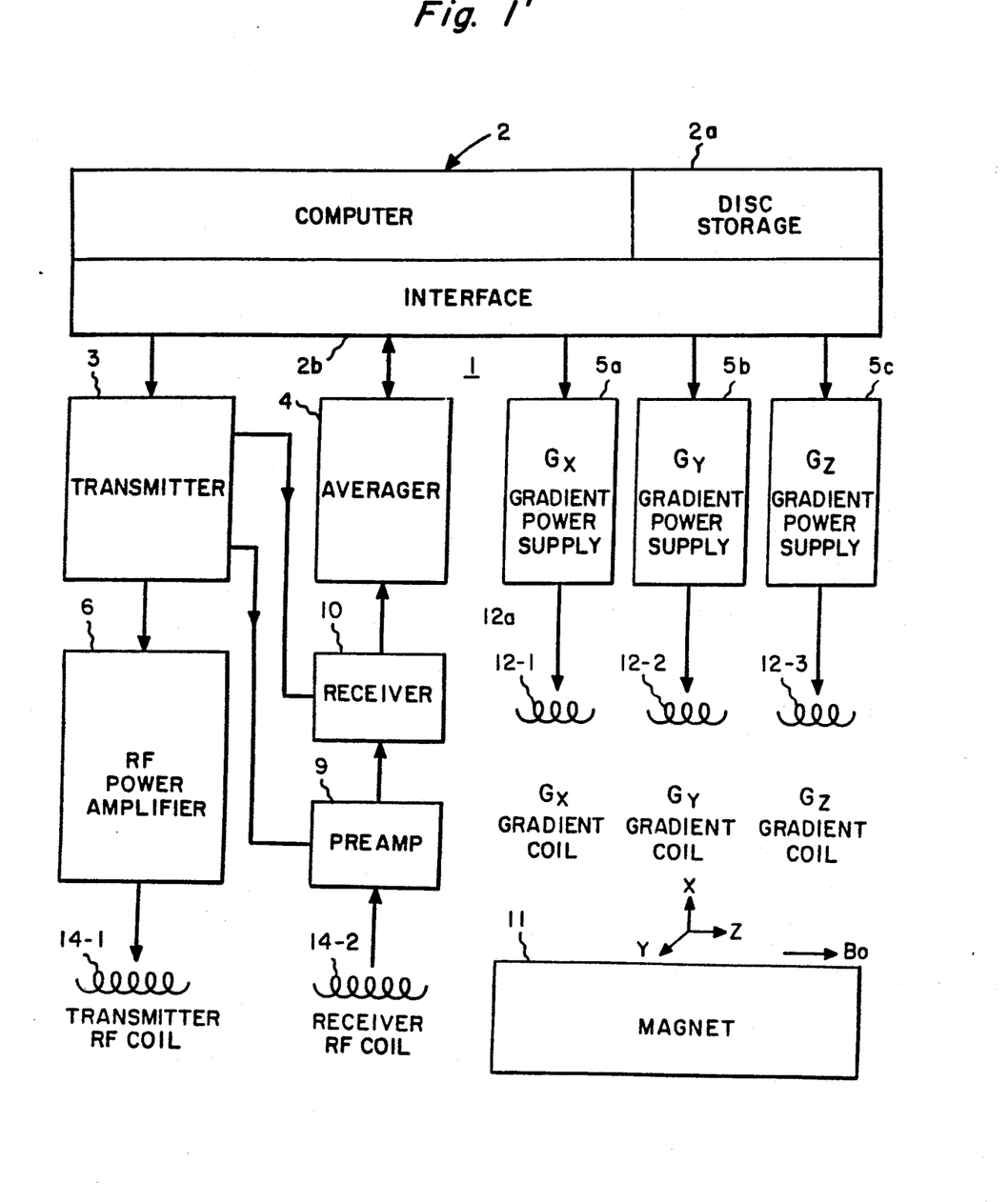
FIG. 1 is a perspective view of the bore of a MRI magnet, and of the gradient and RF coils utilized therein.

FIGS. 1 and 1' show a simplified block diagram of the major components of an NMR imaging system suitable in which is used the invention described herein. The system 1 is made up of a general purpose mini-computer 2 which is functionally coupled to a disk storage unit 2a and an interface unit 2b. An RF transmitter 3, signal averager 4, and gradient power supplies 5a, 5b and 5c for respectively energizing X, Y and Z gradient coils 12-1, 12-2 and 12-3, are all coupled to computer 2 through interface unit 2b.

RF transmitter 3 is gated with pulse envelopes from computer 2 to generate RF pulses having the required modulation to excite nuclear resonance in the object under study. The RF pulses are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite large NMR frequency bandwidths.

The NMR signal is sensed by a receiver coil 14-2, amplified in a low noise preamplifier 9 and applied for further amplification, detection, and filtering to receiver 10. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are beyond the scope of the present invention).

The transmitter and receiver RF coils, if desired, may comprise a single coil 14. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_o$ produced by a magnet means 30. The coils may be isolated from the remainder of the system by enclosure in an RF shielded cage.

Magnetic field gradient coils 12-1, 12-2 and 12-3 are necessary to provide gradients $G_x$, $G_y$, and $G_z$, respectively, as monotonic and linear over the sample volume. Multivalued gradient fields cause a degradation in the NMR signal data, known as aliasing, which leads to severe image artifacts. Nonlinear gradients cause geometric distortions of the image. Thus, main magnet 11 has a central cylindrical bore 11a in which is generated a static magnetic field $B_0$, typically in the axial, or Z Cartesian coordinate direction. The set of coils 12, such as 3 coils 12-1 to 12-3, receiving electrical signals via input connections 12a, provides at least one gradient magnetic field G within the volume of bore 11. Also situated within bore 11 is a RF coil 14, receiving RF energy via at least one input cable 14a, to provide a RF magnetic field $B_1$, typically in the X-Y plane. The use of the coils and magnetic fields shown in FIG. 1 are now well known to the NMR imaging (MRI) arts.

Figure 1A:
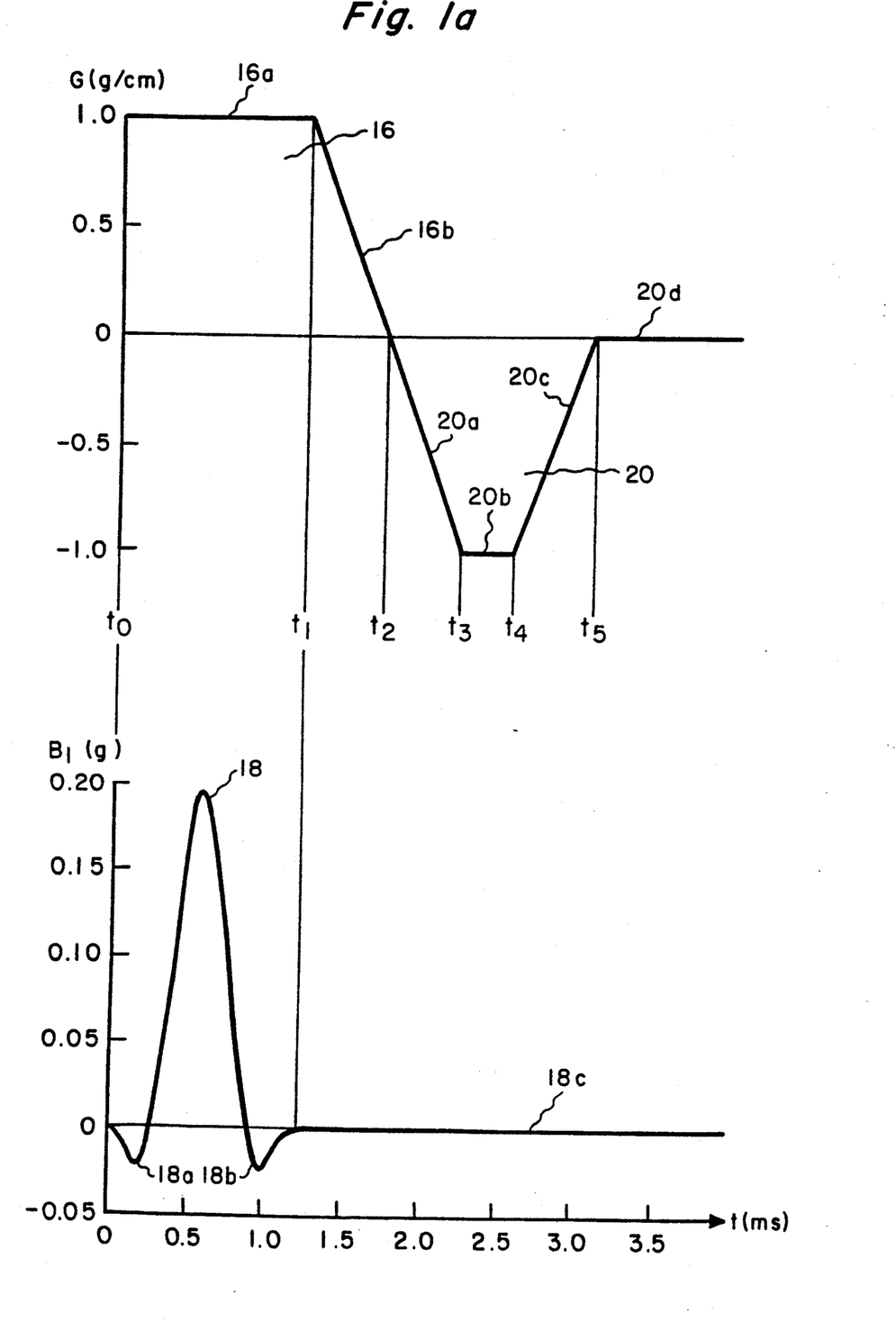
FIG. 1a is a coordinated pair of graphs illustrating the gradient and RF magnetic fields utilized to provide a slice-selection signal pulse in a typical NMR procedure.
Figure 1B:
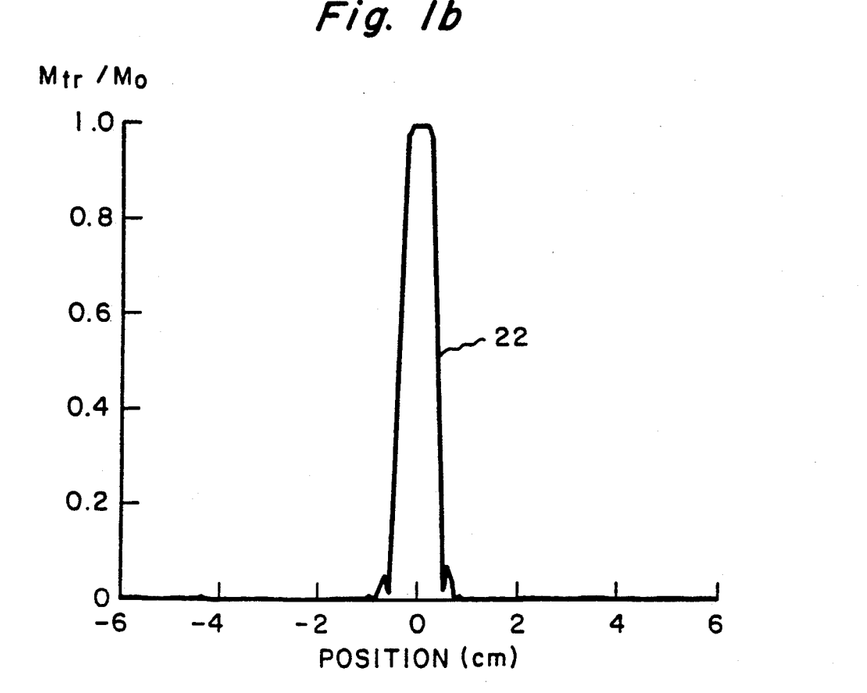
Figure 1C:
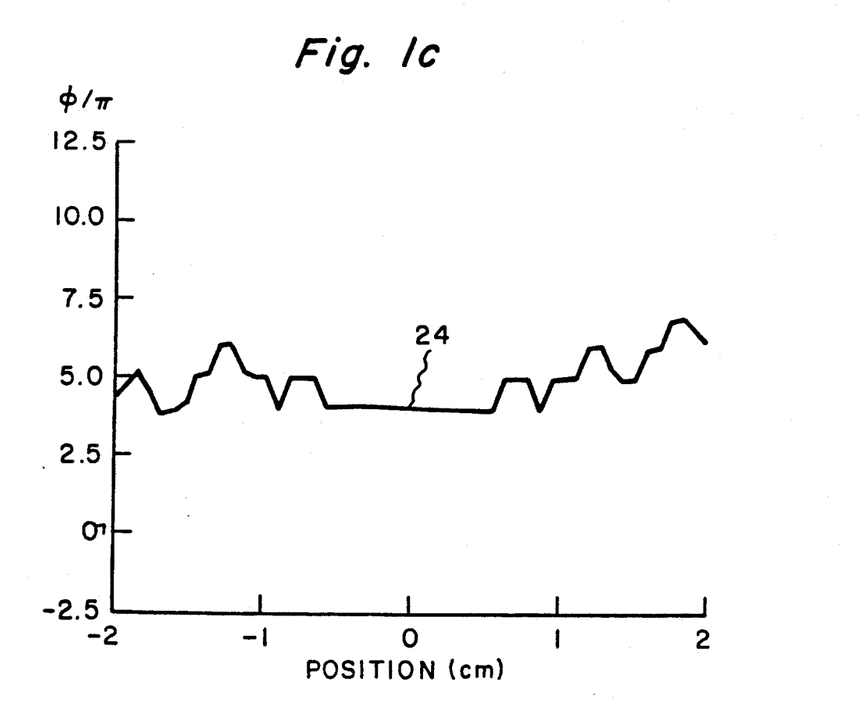

Referring now to FIG. 1a, a 90° slice-selective pulse signal is utilized in many MRI procedures. The pulse signal consists of a magnetic field gradient G portion 16 and a RF magnetic field $B_1$ portion 18, which is present while the substantially-constant amplitude portion 16a of the gradient pulse is generated, between initial time $t_0$ and time $t_1$. The RF magnetic field pulse 18 can be of any selected shape, such as the truncated sin(x)/x RF signal pulse 18 shown, with its reduced-amplitude precedent and subsequent lobes 18a/18b. After carrying out the slice-selection task, the RF pulse signal has a substantially constant (substantially zero-amplitude) portion 18c after time $t_1$; the gradient magnetic field G pulse requires a finite time (from time $t_1$ to time $t_2$) to return to zero, with trailing edge 16b; the actual slice-selection gradient portion 16 may be followed by a compensation portion 20, of opposite amplitude, and with leading edge 20a (ending at time $t_3$) leading into a substantially constant amplitude portion 20b (ending at time $t_4$), and followed by a trailing edge 20c (ending at time $t_5$ when the zero-amplitude portion 20d is reached). While the involved amplitudes (e.g ±1 Gauss/cm for the gradient magnetic field G, and less than 1 Gauss for the RF magnetic field signal $B_1$) are relatively small, relatively small time intervals (typically less than 1 millisecond) are associated with the various changing features and the gradient fields are thus relatively difficult to provide with existing linear gradient power amplifiers. When properly provided, the excited transverse magnetization has a normalized amplitude ($M_{tr}/M_O$) with respect to position which is a relatively narrow spatial slice 22 (FIG. 1b) and has a phase $\phi$ versus position function 24 as shown in FIG. 1c.

Figure 2:
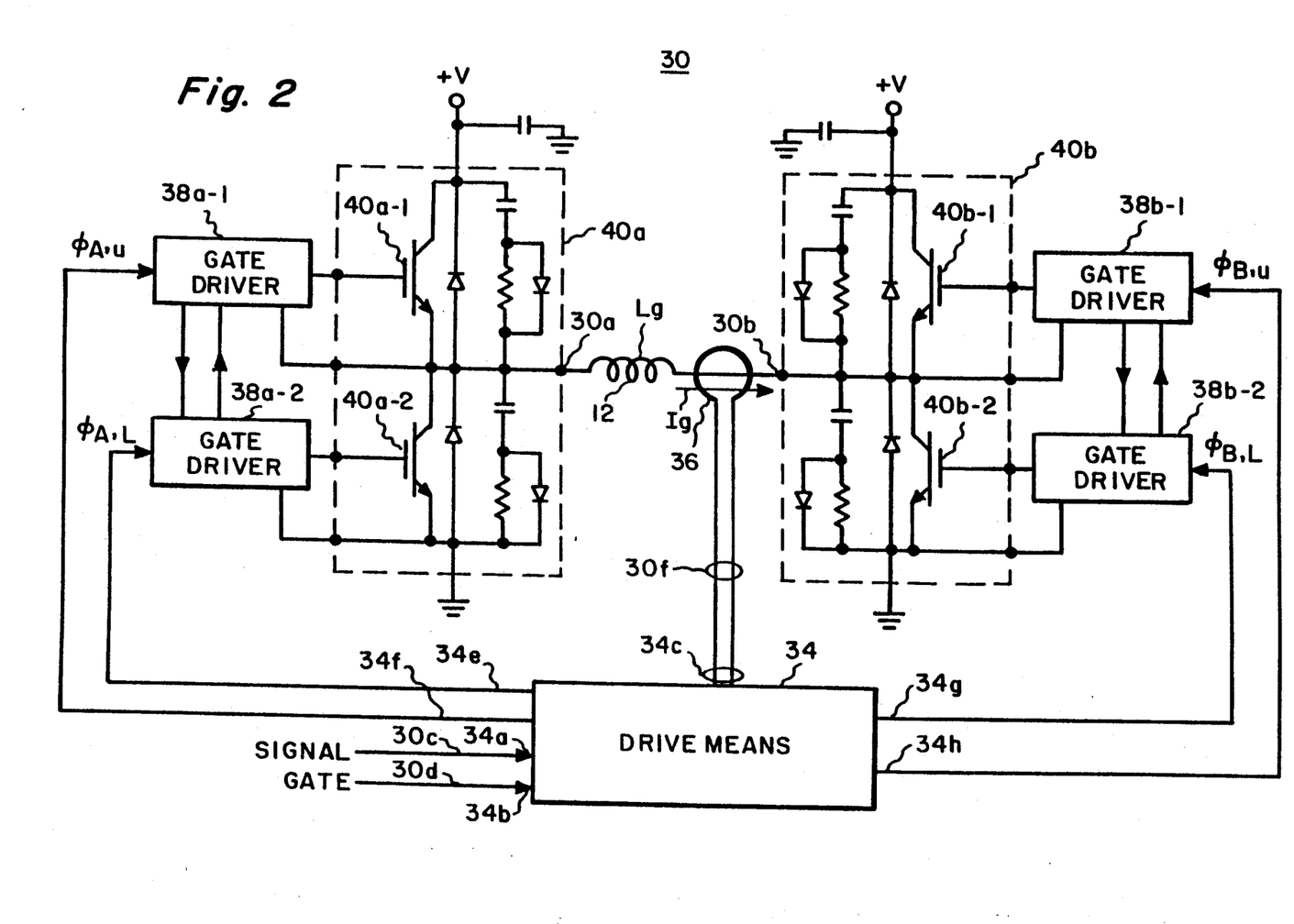
FIG. 2 is a schematic diagram of one possible form of switch-mode gradient power amplifier.

In higher-speed NMR imaging procedures, faster transient change of a gradient magnetic field G can be provided by replacing an existing linear gradient power amplifier with a switch-mode power amplifier. One possible switch-mode power amplifier 30 embodiment is shown in FIG. 2. Amplifier 30 has first and second outputs 30a and 30b between which an existing one of gradient coils 12 is connected. The gradient magnetic field G of coil 12 is formed responsive to a flow of a gradient current $I_g$ therethrough, which current is responsive to the presence of an input signal, at input 30c, and an enable-gate signal at another input 30d. The input and gate signals are provided to separate inputs 34a and 34b, respectively, of a drive means 34, which may also receive a feedback signal, at an input 34c, from a current-monitoring sensor 36. Responsive to all of the input signals, four output signals are provided at drive means outputs 34e/4 34h, respectively. These signals properly phase the turn-on and turn-off of upper and lower gate driver means 38a-1, 38b-1, 38a-2 and 38b-2, on opposite sides of the amplifier. The gate drivers 34a or 34b, on the respective left and right sides of the amplifier, communicate between themselves to assure that only one of the upper or lower gate drivers is on at any instant. Thus, the switching devices 40a-1 or 40a-2 and 40b-1 or 40b-2 are operated in mutually exclusive fashion. The full-bridge switch-mode power amplifier 30 can thus provide extremely rapid changes in the current $I_g$ flowing in the gradient coil inductance $L_g$.

Figure 2A:
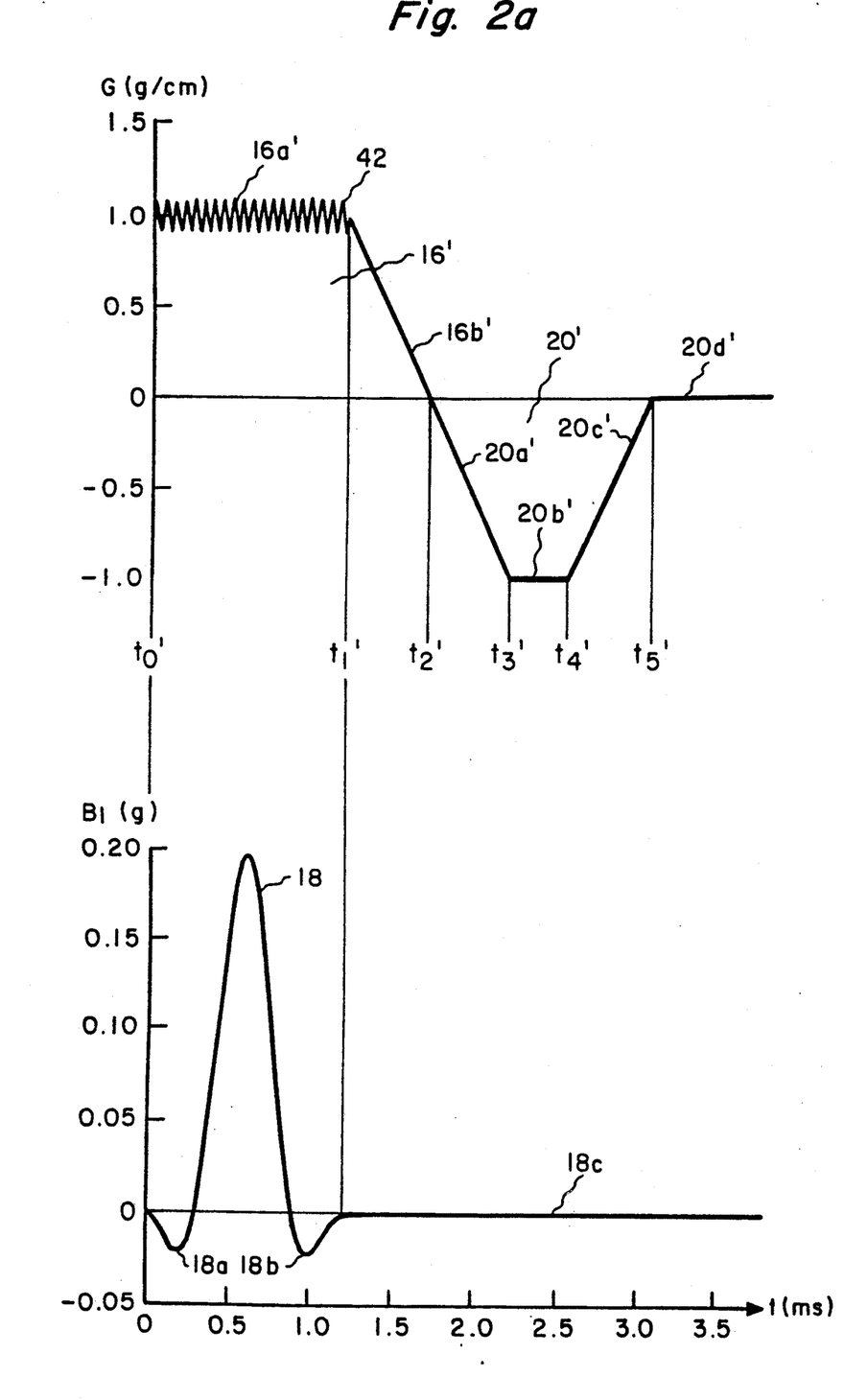
FIG. 2a is a coordinated pair of graphs illustrating the slice-selection signal pulse gradient and RF magnetic fields provided by in a MRI system using a switch-mode gradient power amplifier.
Figure 2B:
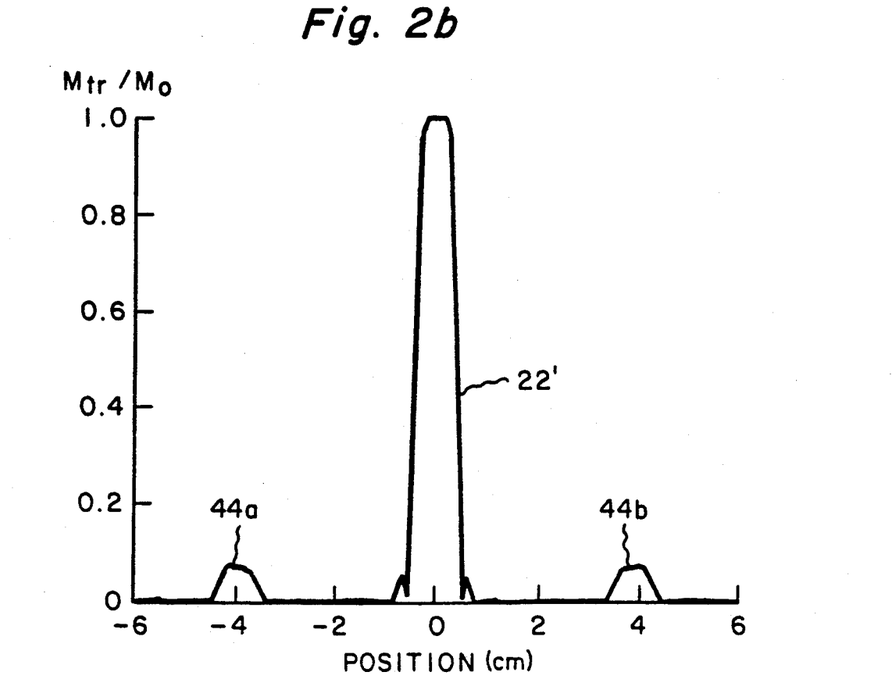
Figure 2C:
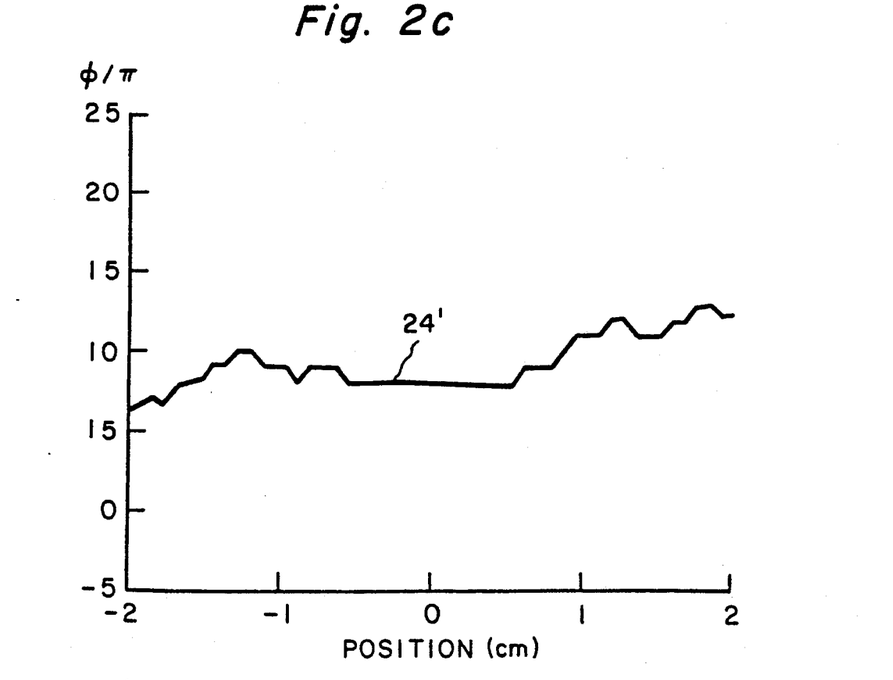

Unfortunately, one consequence of use of a switch-mode power amplifier is that a ripple amplitude, typically on the order of 1% to 10% of the total gradient amplitude, is provided in the pulse top portion 16a' of the slice selection gradient signal pulse 16' (FIG. 2a). The ripple acts to produce modulation sidebands 44a and 44b (FIG. 2b) at spatial positions removed from the central slice-selective profile 22'; the spatial sidebands are located away from central pulse 22' by a distance proportional to the ripple frequency (e.g. 20 cycles over 1.2 milliseconds). It is the deleterious sidebands 44 in the spatial profile which provides undesired aliasing responses which must be removed.

In accordance with the invention, the deleterious aliasing-spatial-sideband effects of amplitude ripple upon the gradient magnetic field signal pulse of a slice-selective pulse signal, such as may be induced by a switch-mode power amplifier, is removed by modulating the RF magnetic field $B_1$ signal to cause the effective field vector to point in the same direction, throughout the pulse trajectory, as the field vector would point in the normal (non-ripple) pulse. Thus, the amplitude of the RF waveform signal is modulated with the same ripple as the magnetic field gradient signal, so that the amplitude of the effective field vector is still also modulated, but does not have a noticeable effect on the relative transverse magnetization profile for ripple amplitudes less than about 20%. If absolute control over the gradient waveform were provided, then the phase and duration of the time increments of the pulse could be varied to compensate for the changing amplitude of the effective field vector, to result in an exact compensation on resonance.

Figure 3:
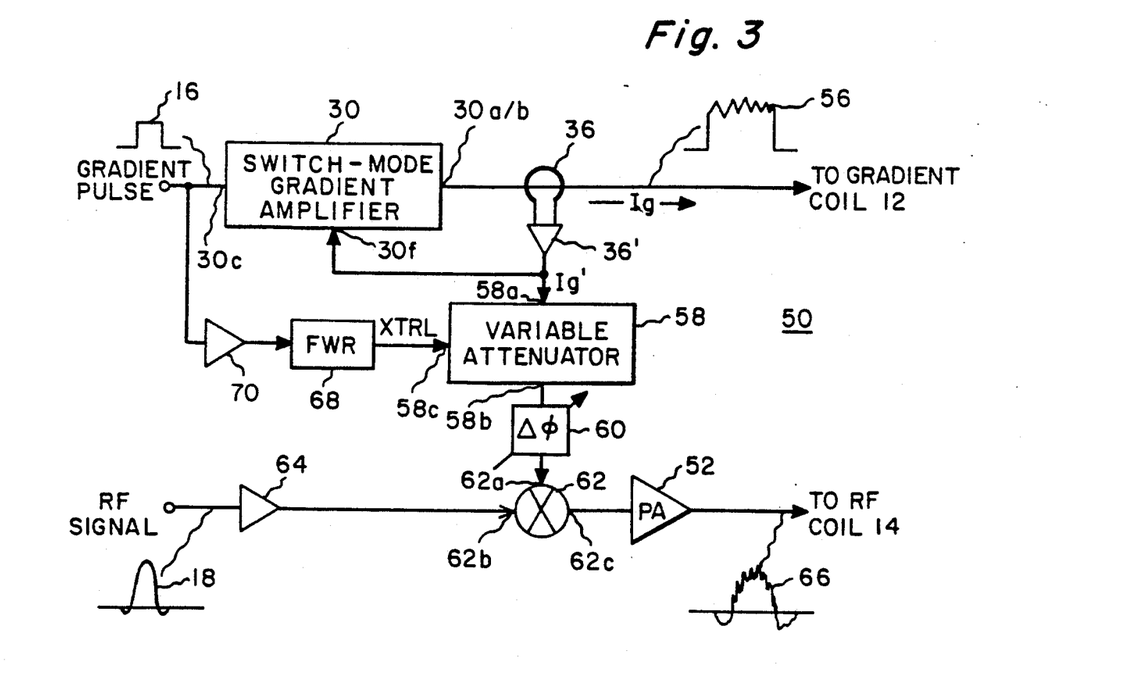
FIG. 3 is a schematic block diagram of apparatus for reducing the effect of switch-mode gradient power amplifier output signal ripple upon the slice-selection pulse signals.

This method is carried out with the apparatus 50, of which one presently preferred embodiment is shown in FIG. 3. Apparatus 50 operates with switch-mode gradient power amplifier 30, and an existing RF power amplifier 52. The flat-topped gradient drive signal pulse 16 is applied to the input 30c of the gradient amplifier to provide the desired gradient coil current $I_g$ flowing from the output thereof, with waveform 56 having the undesired ripple at the top of the signal pulse. The amplitude of the gradient coil current pulse 56 is sensed by current sensor 36, which provides (with optional amplification and/or processing in means 36') a sampled gradient current signal $I_g'$. This signal is fed back to the gradient amplifier feedback input 30f and is further applied to the signal input 58a of a variable attenuator means 58. The output 58b of the variable attenuator means 58 provides a normalized gradient output signal, of amplitude determined by the amplitude of a control XTRL signal at a control input 58c. The normalized gradient signal can be applied directly, or through a variable-phasesetting means 60, to a first input 62a of a RF modulation means 62. Modulation means 62 has a second input 62b receiving the input RF signal pulse 18; additional RF amplification means 64 may be utilized. The phase-adjusted, normalized-amplitude gradient ripple signal modulates the RF signal and the ripple-modulated RF signal appears at a modulation means output 62c, for amplification in power amplifier PA means 52, to provide a ripple-modulated RF power signal pulse 66 for application to RF coil 14. The variable-attenuator control XTRL signal is provided at the output of a full-wave rectifier (FWR) means 48, which receives the gradient input signal pulse 16; additional amplification of the gradient signal pulse 16 may be provided by amplifier means 70, if required.

Figure 3A:
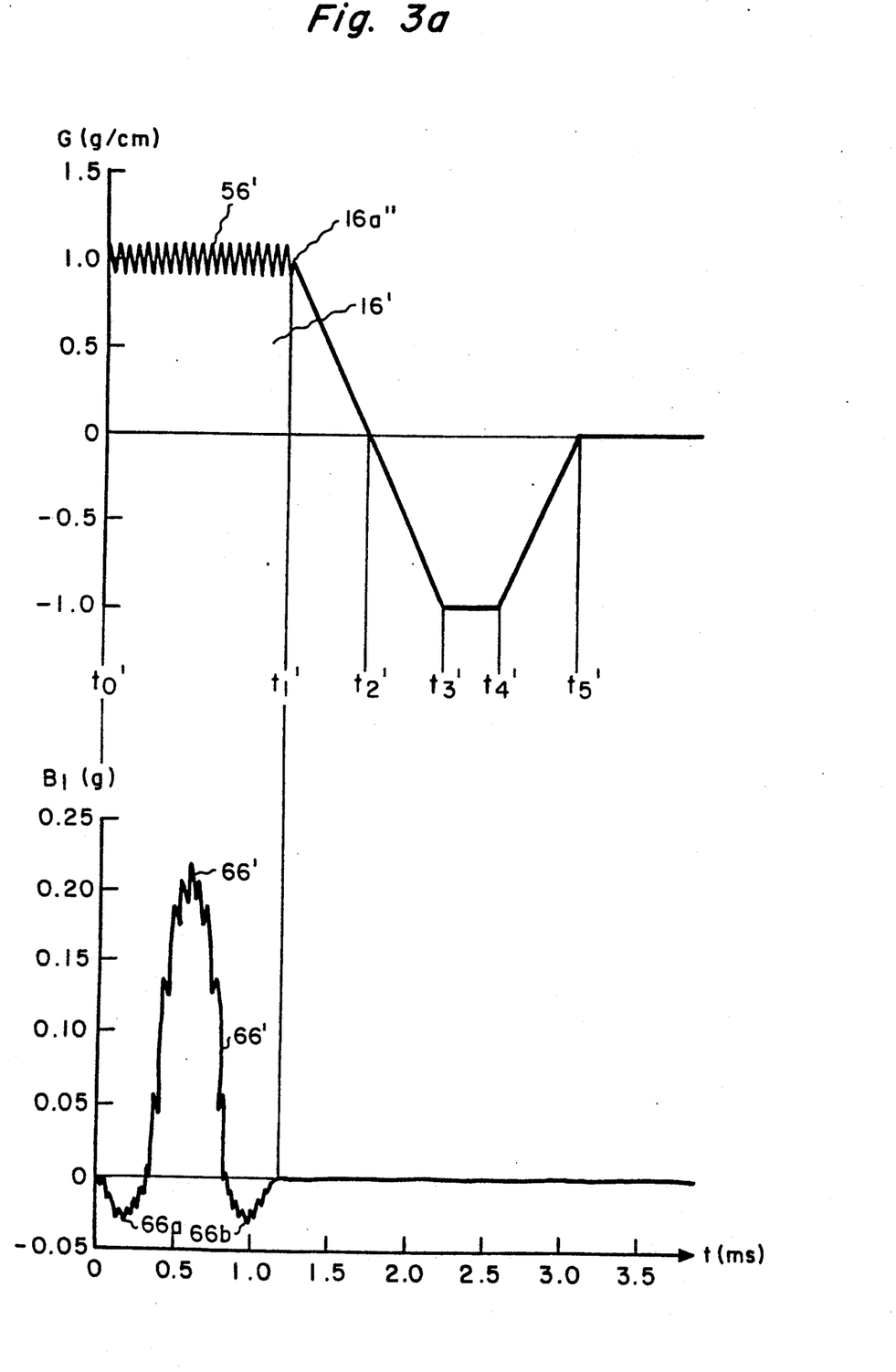
FIG. 3a is a coordinated pair of graphs illustrating the slice-selection signal pulse gradient and modified RF magnetic fields provided by the apparatus of FIG. 3.
Figure 3B:
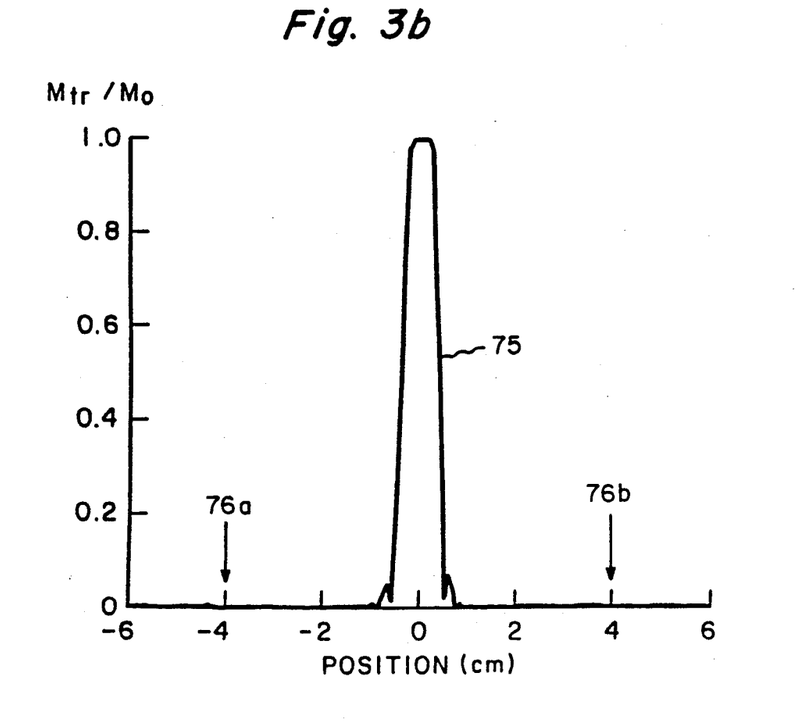
Figure 3C:
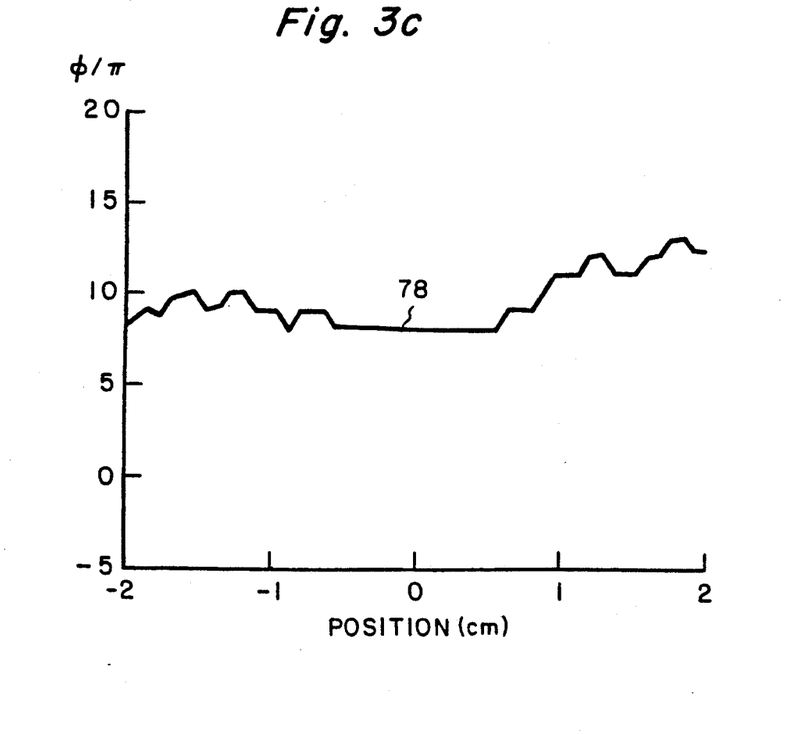

Referring now to FIG. 3a, even though the use of the switch-mode power amplifier 30 causes the slice selection gradient signal pulse 16' to have a pulse top portion 16a'' with an amplitude ripple 56', the amplitude of the RF signal pulse 66, and its sidelobes 66a/66b (if any), is modulated with a ripple portion 66' of controlled amplitude and phase. This is true whether the RF signal amplitude causes a tip angle of 90° (shown) or less, or is even large enough to cause a 180° tip for inversion or refocusing. Since the XTRL signal is obtained prior to switch-mode gradient amplifier 30, the attenuation applied to the ripple signal $I_g'$ is proportional to the amplitude of the commanded (desired) gradient signal; the use of a full-wave rectifier means insures that the amplitude attenuation is independent of the gradient signal pulse polarity. Normally, circuit delays are sufficiently small, relative to the ripple period, so that no significant phase shift is introduced between the gradient and RF ripple waveforms, and phase shift means 60 may not be required. If the ripple delay is, in fact, sufficiently small, the modulated RF magnetic field will in fact cause the affected field vector to be maintained in the same direction throughout the pulse trajectory as that field vector would point in a non-ripple gradient pulse situation. The resulting normalized spatial magnetization profile 75 is shown in FIG. 3b; note that the deleterious spatial-aliasing sidebands 76a/76b are of substantially zero amplitude. An acceptable phase function (FIG. 3c) is achieved.

Figure 4A:
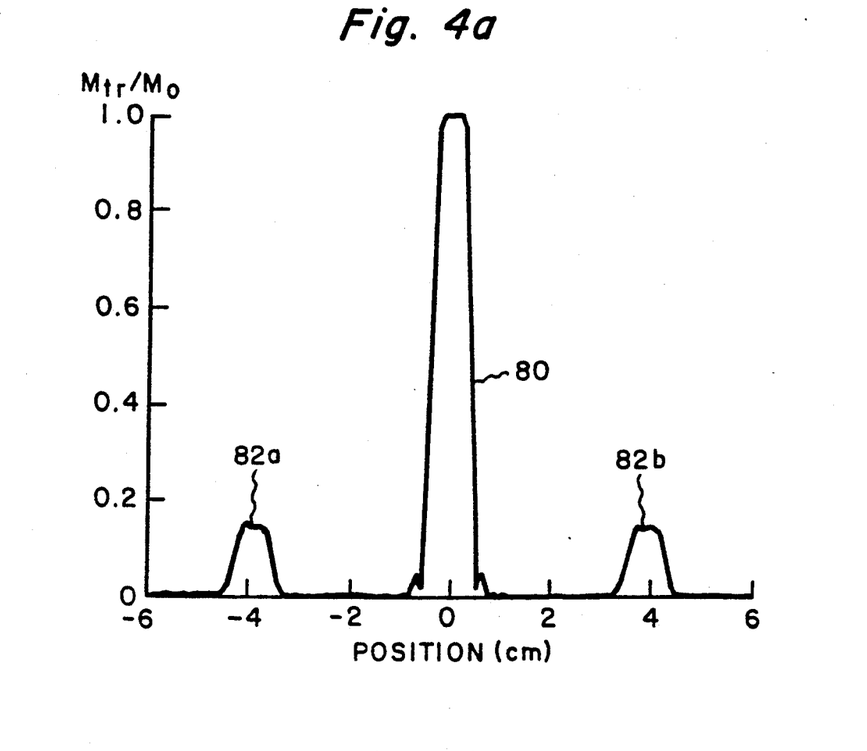
Figure 4B:
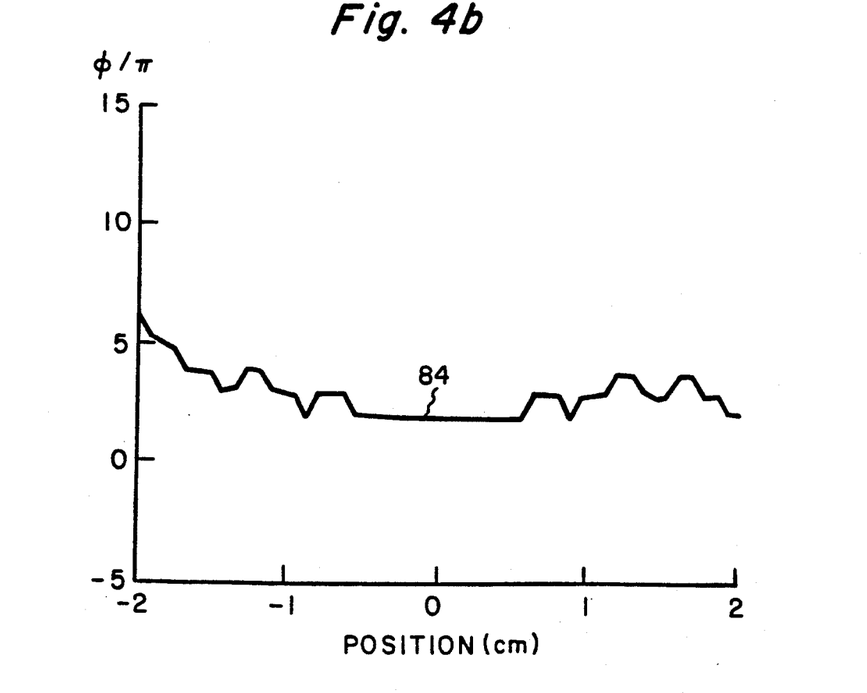

Referring now to FIG. 4a and 4b, the effect of significant circuit delay, at the ripple frequency, is illustrated. The normalized spatial magnetization profile has the desired central slice-selective peak 80, but aliasing sidebands 82a and 82b are present. In fact, if the delay is adjusted for a worse case situation, the amplitude of undesired sidebands 82a and 82b could be as much as twice the amplitude of the sidebands 44a/44b (FIG. 2b) provided without modulation of the RF signal, i.e. in the original situation. Thus, provision for the variable phasing means 60 is desirable, and adjustment thereof may be required for a particular configuration of apparatus 50 (as by preliminary imaging of a phantom object) to minimize the spatial sidebands and thus minimize aliasing artifacts.

While several presently preferred embodiments of our novel invention have been described in detail herein, many modifications and variations will now become apparent to those skilled in the art. It is our intent, therefore, to be limited only by the scope of the appending claims and not by the specific details and instrumentalities presented by way of explanation herein.

What we claim is:

1. A method of reducing NMR imaging degradation due to magnetic field gradient signal amplitude ripple, comprising the steps of:
   (a) sensing the magnitude of gradient signal amplitude ripple;
   (b) normalizing the sensed ripple signal amplitude to a commanded gradient amplitude; and
   (c) modulating a RF signal, utilized with the gradient signal, with the normalized-amplitude sensed ripple signal, to cause an effective magnetic field to have a vector pointing substantially in the same direction as would an effective field vector formed with a gradient signal devoid of ripple.

2. The method of claim 1, wherein step (a) includes the step of sensing the ripple in the amplitude of an electric current causing formation of the gradient magnetic field.

3. The method of claim 2, wherein step (b) includes the step of attenuating the sensed ripple signal by an amount determined by the commanded gradient amplitude.

4. The method of claim 3, wherein step (b) includes the step of establishing the attenuation amount responsive to the absolute value of the commanded gradient amplitude.

5. The method of claim 4, further comprising the step of adjusting the phase of the normalized ripple signal, prior to modulating the RF signal therewith, to obtain a desired reduction of degradation.

6. The method of claim 3, further comprising the step of adjusting the phase of normalized ripple signal, prior to modulating the RF signal therewith, to obtain a desired reduction of degradation.

7. The method of claim 2, further comprising the step of adjusting the phase of the normalized ripple signal, prior to modulating the RF signal therewith, to obtain a desired reduction of degradation.

8. The method of claim 1, further comprising the step of adjusting the phase of the normalized ripple signal, prior to modulating the RF signal therewith, to obtain a desired reduction of degradation.

9. The method of claim 1, wherein step (c) includes the step of modulating an input RF signal prior to power amplification and transmission to a system RF antenna.

10. The method of claim 1, wherein the commanded gradient occurs during a slice selection signal phase.

11. The method of claim 1, wherein the RF signal amplitude causes a tip angle of up to 90°.

12. The method of claim 1, wherein the RF signal amplitude causes a tip angle of about 180°.

13. Apparatus for reducing NMR imaging degradation due to magnetic field gradient amplitude ripple, comprising:
   means for sensing the magnitude of gradient signal amplitude ripple;
   means for normalizing the sensed ripple signal amplitude responsive to a commanded gradient amplitude; and
   means for modulating a RF signal, utilized with the gradient signal, with the normalized-amplitude sensed ripple signal, to cause the RF and gradient magnetic field to have an effective vector pointing substantially in the same direction as would an effective field vector formed with a gradient signal devoid of ripple.

14. The apparatus of claim 13, wherein said sensing means senses the magnitude of ripple in a gradient current output to a gradient magnetic field-forming structure.

15. The apparatus of claim 14, wherein the structure is a gradient coil located within a bore of an NMR magnet.

16. The apparatus of claim 14, wherein said normalizing means includes means for attenuating the amplitude of the sensed current ripple by an amount determined by the commanded gradient amplitude.

17. The apparatus of claim 16, wherein said normalizing means further includes means for establishing the attenuation amount responsive to the absolute value of the commanded gradient amplitude.

18. The apparatus of claim 17, further comprising means for adjusting the phase of the normalized ripple signal, prior to modulating the RF signal therewith, to obtain a desired reduction of degradation.

19. The apparatus of claim 13, wherein an output signal from the modulating means is amplified and applied to a system RF antenna.

* * * * *